(12) United States Patent
Lee

(10) Patent No.: US 11,476,819 B2
(45) Date of Patent: Oct. 18, 2022

(54) PROVIDING A CONSTANT IMPEDANCE AT AN INPUT OF A SIGNAL AMPLIFIER FOR DIFFERENT GAIN MODES

(71) Applicant: SKYWORKS SOLUTIONS, INC., Irvine, CA (US)

(72) Inventor: Junhyung Lee, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 49 days.

(21) Appl. No.: 17/014,017

(22) Filed: Sep. 8, 2020

(65) Prior Publication Data

US 2021/0111684 A1 Apr. 15, 2021

Related U.S. Application Data

(63) Continuation of application No. 16/405,951, filed on May 7, 2019, now Pat. No. 10,771,029, which is a
(Continued)

(51) Int. Cl.
*H03F 1/22* (2006.01)
*H03G 3/30* (2006.01)
(Continued)

(52) U.S. Cl.
CPC ......... *H03G 3/3042* (2013.01); *H03F 1/0277* (2013.01); *H03F 1/223* (2013.01); *H03F 1/56* (2013.01); *H03F 3/195* (2013.01); *H03F 3/211* (2013.01); *H03F 3/245* (2013.01); *H03F 3/72* (2013.01); *H03G 1/0029* (2013.01); *H03G 1/0088* (2013.01); *H03G 3/001* (2013.01); *H03G 3/3063* (2013.01); *H03F 2200/111* (2013.01); *H03F 2200/222* (2013.01);
(Continued)

(58) Field of Classification Search
CPC . H03F 1/22; H03F 1/223; H03F 1/226; H03F 3/72
USPC .................................................. 330/51, 311
See application file for complete search history.

(56) References Cited

U.S. PATENT DOCUMENTS 8,111,105 B1 * 2/2012 Zhou .................... H03G 1/0088
330/300
8,466,749 B2 * 6/2013 Ahn .......................... H03F 3/72
330/311
(Continued)

FOREIGN PATENT DOCUMENTS

| WO | 2012145540 A1 | 10/2012 |
| WO | 2014150333 A1 | 9/2014 |
| WO | 2015017487 A1 | 2/2015 |

*Primary Examiner* — Henry Choe
(74) *Attorney, Agent, or Firm* — Chang & Hale LLP

(57) ABSTRACT

Disclosed herein are methods for use in operating signal amplifiers that provide impedance adjustments for different gain modes. The impedance adjustments are configured to result in a constant real impedance for an input signal at the amplifier. Some of the disclosed methods adjust impedance using switchable inductors to compensate for changes in impedance with changing gain modes. Some of the disclosed methods adjust a device size to compensate for changes in impedance with changing gain modes. By providing impedance adjustments, the amplifiers reduce losses and improve performance by improving impedance matching over a range of gain modes.

19 Claims, 8 Drawing Sheets

Related U.S. Application Data continuation of application No. 15/691,625, filed on Aug. 30, 2017, now Pat. No. 10,284,160.

(60) Provisional application No. 62/382,252, filed on Aug. 31, 2016.

(51) Int. Cl.
| | |
|---|---|
| *H03G 1/00* | (2006.01) |
| *H03G 3/00* | (2006.01) |
| *H03F 1/02* | (2006.01) |
| *H03F 1/56* | (2006.01) |
| *H03F 3/21* | (2006.01) |
| *H03F 3/72* | (2006.01) |
| *H03F 3/195* | (2006.01) |
| *H03F 3/24* | (2006.01) |
| *H04B 1/16* | (2006.01) |

(52) U.S. Cl.
CPC .. *H03F 2200/294* (2013.01); *H03F 2200/387* (2013.01); *H03F 2200/451* (2013.01); *H03F 2203/7221* (2013.01); *H04B 1/16* (2013.01)

(56) References Cited

U.S. PATENT DOCUMENTS

| | | | |
|---|---|---|---|
| 2006/0097792 A1* | 5/2006 | Ryu | ................ H03G 3/001 330/311 |
| 2008/0224770 A1 | 9/2008 | Kim et al. | |
| 2009/0195316 A1 | 8/2009 | Park et al. | |
| 2012/0056681 A1 | 3/2012 | Lee | |
| 2015/0230185 A1 | 8/2015 | Vahid Far et al. | |

* cited by examiner

PROVIDING A CONSTANT IMPEDANCE AT AN INPUT OF A SIGNAL AMPLIFIER FOR DIFFERENT GAIN MODES

CROSS-REFERENCE TO RELATED APPLICATIONS

This application is a continuation of U.S. patent application Ser. No. 16/405,951 filed May 7, 2019 and entitled "AMPLIFIER WITH SCALABLE IMPEDANCE ADJUSTMENTS OVER GAIN MODES," which is a continuation of U.S. patent application Ser. No. 15/691,625 filed Aug. 30, 2017 and entitled "AMPLIFIER WITH IMPROVED RETURN LOSS AND MISMATCH OVER GAIN MODES" (now U.S. Pat. No. 10,284,160 issued May 7, 2019), which claims priority to U.S. Provisional Application No. 62/382,252 filed Aug. 31, 2016 and entitled "AMPLIFIER WITH IMPROVED RETURN LOSS AND MISMATCH OVER GAIN MODES," each of which is expressly incorporated by reference herein in its entirety for all purposes.

BACKGROUND

Field

The present disclosure generally relates to amplifiers for wireless communication devices.

Description of Related Art

In electronic applications, such as radio-frequency (RF) applications, it is sometimes desirable to amplify a signal. For example, a to-be-transmitted signal can be amplified by a power amplifier, and a received signal can be amplified by a low-noise amplifier. In some applications, it is beneficial to reduce impedance mismatches in the amplification chain to improve signal quality.

SUMMARY

According to a number of implementations, the present disclosure relates to a signal amplifier having an input impedance that varies over different bias currents, the signal amplifier comprising a gain stage including a plurality of switchable amplification branches each capable of being activated such that one or more of the activated amplification branches provides a targeted adjustment to the input impedance.

In some embodiments, the plurality of switchable amplification branches each include a switching transistor and an RF stage transistor. In further embodiments, in a first gain mode, a first plurality of the RF stage transistors is activated and in a second gain mode, lower than the first gain mode, a second plurality of the RF stage transistors is activated, the number of activated RF stage transistors being less in the second gain mode than the first gain mode.

According to a number of implementations, the present disclosure relates to a signal amplifier comprising a variable-gain stage configured to provide a plurality of gain levels that result in different input impedance values presented to a respective signal by the variable-gain stage, the variable-gain stage including a plurality of switchable amplification branches each capable of being activated such that one or more of the activated amplification branches provides a targeted adjustment to the respective input impedance values.

In some embodiments, the plurality of switchable amplification branches each include a switching transistor and an RF stage transistor. In further embodiments, in a first gain mode, a first plurality of the RF stage transistors is activated and in a second gain mode, lower than the first gain mode, a second plurality of the RF stage transistors is activated, the number of activated RF stage transistors being less in the second gain mode than the first gain mode.

According to a number of implementations, the present disclosure relates to a signal amplifier comprising a variable-gain stage configured to provide a plurality of gain levels that result in different input impedance values presented to a respective signal by the variable-gain stage, the variable-gain stage including a scalable impedance block having a plurality of switchable inductive elements that are configured to be activated to provide a targeted adjustment to the respective input impedance values.

In some embodiments, the scalable impedance block is configured to increase the inductance provided with decreases in gain levels. In some embodiments, the scalable impedance block is coupled to a source of an RF stage transistor of the variable-gain stage.

According to a number of implementations, the present disclosure relates to a radio-frequency (RF) amplifier that includes an input node and an output node. The amplifier also includes a gain stage including a plurality of switchable amplification branches each capable of being activated such that one or more of the activated amplification branches provides a targeted adjustment to the input impedance.

In some embodiments, the RF amplifier is a low-noise amplifier (LNA). In further embodiments, the LNA is implemented in a cascode configuration having an input stage and a cascode stage.

In some embodiments, the targeted adjustment to the input impedance at each of a plurality of gain settings is selected to provide an approximately constant impedance at the input node. In some embodiments, the plurality of transistors is configured so that one transistor is operational in a lowest gain setting, and an additional transistor is operational for each increased gain setting.

According to a number of implementations, the present disclosure relates to a method for amplifying a signal, the method including configuring a gain stage to be in a selected one of a plurality of gain settings, at least some of the gain settings resulting in different impedances presented to the signal. The method also includes adjusting the impedance presented to the signal by the gain stage for the selected gain setting, the adjusted impedance being configured to provide a targeted constant value of the impedance at the input across the plurality of gain settings.

In some embodiments, the gain stage is part of a low-noise amplifier (LNA). In some embodiments, the adjusted impedances result in an approximately constant impedance among the plurality of gain settings. In some embodiments, the adjusting of the impedance includes adjusting one or more of an inductance coupled to a source of an RF stage transistor of the gain stage.

In some embodiments, the adjusting of the impedance includes operating a plurality of transistors in an electrically parallel configuration, each transistor having an associated switch that selectively activates the associated transistor. In further embodiments, the operating of the plurality of transistors includes performing a switching operation at the drain of each transistor to control the operation of the transistor.

According to a number of implementations, the present disclosure relates to a semiconductor die having a radio-frequency (RF) circuit that includes a substrate and an RF amplifier implemented on the substrate, the RF amplifier including a gain stage including a plurality of switchable amplification branches each capable of being activated such that one or more of the activated amplification branches provides a targeted adjustment to the input impedance.

In some embodiments, the substrate includes a silicon-on-insulator (SOI) substrate. In some embodiments, the RF amplifier is a low-noise amplifier (LNA).

According to a number of implementations, the present disclosure relates to a radio-frequency (RF) module that includes a packaging substrate configured to receive a plurality of components and an RF amplifier implemented on the packaging substrate, the RF amplifier including a gain stage including a plurality of switchable amplification branches each capable of being activated such that one or more of the activated amplification branches provides a targeted adjustment to the input impedance.

In some embodiments, the RF amplifier is implemented on a semiconductor die that is mounted on the packaging substrate. In some embodiments, the RF amplifier is a low-noise amplifier (LNA). In some embodiments, the RF module is a diversity receive (DRx) module.

According to a number of implementations, the present disclosure relates to a wireless device that includes an antenna configured to at least receive a radio-frequency (RF) signal. The wireless device also includes an RF amplifier in communication with the antenna, and including a gain stage including a plurality of switchable amplification branches each capable of being activated such that one or more of the activated amplification branches provides a targeted adjustment to the input impedance to provide a targeted phase. The wireless device also includes a transceiver configured to process an amplified RF signal with the targeted phase from RF amplifier.

In some embodiments, the wireless device is a cellular phone configured to include different gains in receive operations.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Overview

Figure 1:
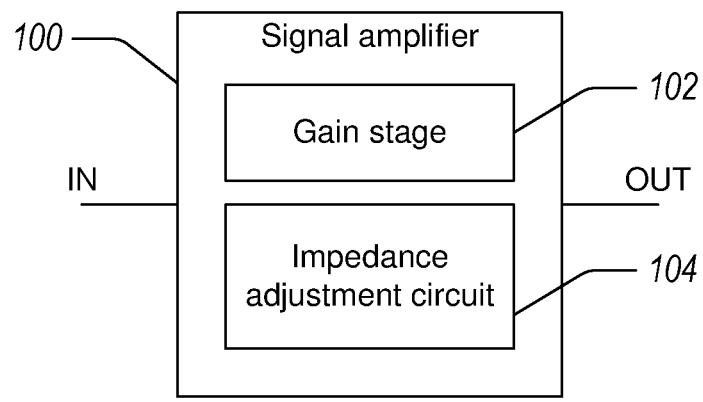
FIG. 1 illustrates a signal amplifier having a gain stage and an impedance adjustment circuit.

Described herein are architectures, circuits, devices and methods related to, among others, radio-frequency (RF) amplifiers having impedance adjustment functionality for various gain modes. FIG. 1 depicts a signal amplifier 100 having a gain stage 102 and an impedance adjustment circuit 104. Such a signal amplifier 100 can receive an input signal (IN) and amplify such a signal to generate an output signal (OUT). In certain implementations, the gain stage 102 includes one or more amplifying transistors. For the purpose of description, various examples related to such signal amplifier 100 are described in the context of a low-noise amplifier (LNA). However, it will be understood that one or more features of the present disclosure can also be implemented for other types of signal amplifiers, including power amplifiers (PAs).

In many LNA applications, it is desirable to match impedances to increase or maximize power transfer between signal processing stages. Such a performance feature can maintain desirable signal characteristics in, for example, receive demodulation over different LNA gain modes, especially in higher order modulation systems. In some embodiments, an LNA circuit having one or more features as described herein can be configured to adjust impedances to match an input impedance at an input of the LNA circuit over different gain modes. It may also be desirable to have a real value of an input impedance to be close to a target value (e.g., 50Ω) to eliminate or minimize significant reflection or mismatch that can lead to performance degradation The impedance adjustment circuit 104 can provide a scalable gain stage having switchable amplification branches that are each capable of being activated. By selectively activating amplification branches, a targeted, tailored, or desired adjustment to the input impedance can be provided. Similarly, the impedance adjustment circuit 104 can provide a scalable impedance block having switchable inductive elements that are capable of being activated. By selectively activating inductive elements, a targeted, tailored, or desired adjustment to the input impedance can be provided.

Advantageously, the impedance adjustment circuit 104 can be configured to reduce or eliminate power loss by fixing LNA input impedance to transfer maximum power over gain modes. The impedance adjustment circuit 104 can be configured to improve receive NF performance by reducing or minimizing impedance mismatches from the previous signal processing stage. The impedance adjustment circuit 104 can be configured to maintain pre-LNA filter performance by reducing or eliminating impedance mismatch with the LNA circuit.

Figure 2:
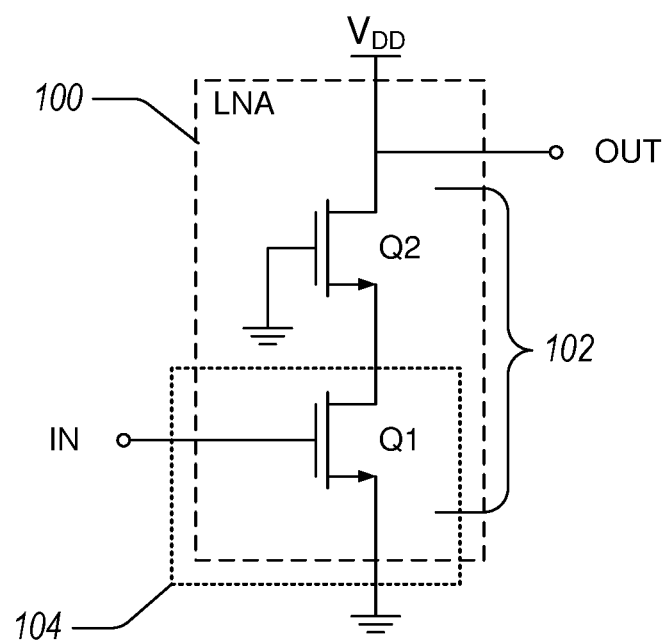
FIG. 2 illustrates that a low-noise amplifier (LNA) having one or more features as described herein can include first and second transistors implemented in a cascode configuration and an impedance adjustment circuit.

FIG. 2 shows that an LNA 100 having one or more features as described herein can include first and second transistors (collectively indicated as a gain stage 102) implemented in a cascode configuration. For example, the first transistor Q1 can be configured to operate as a common source device (also referred to as an RF stage), and the second transistor Q2 can be configured to operate as a common gate device (also referred to as a cascode stage). More particularly, an input signal (IN) is shown to be provided to a gate of the first transistor Q1, and the amplified signal is shown to be output through its drain. The source of the first transistor Q1 is shown to be coupled to ground. The amplified signal from the drain of the first transistor Q1 is shown to be provided to a source of the second transistor Q2 for further amplification, and such further amplified signal is shown to be output through the drain of the second transistor Q2. The gate of the second transistor Q2 is shown to be coupled to ground. The first and second transistors Q1, Q2 can be biased appropriately. In the example of FIG. 2, the second transistor Q2 is shown to be provided with a supply voltage VDD at its drain.

FIG. 2 further shows that in some embodiments, the LNA 100 can include or be provided with an impedance adjustment circuit 104. Various examples of such an impedance adjustment circuit are described herein in greater detail.

In the example of FIG. 2, the impedance adjustment circuit 104 is shown to be associated with the first transistor Q1 (RF stage). However, it will be understood that such a phase compensation circuit can be provided for either or both of the first and second transistors Q1 (RF stage), Q2 (cascode stage).

Figure 3:
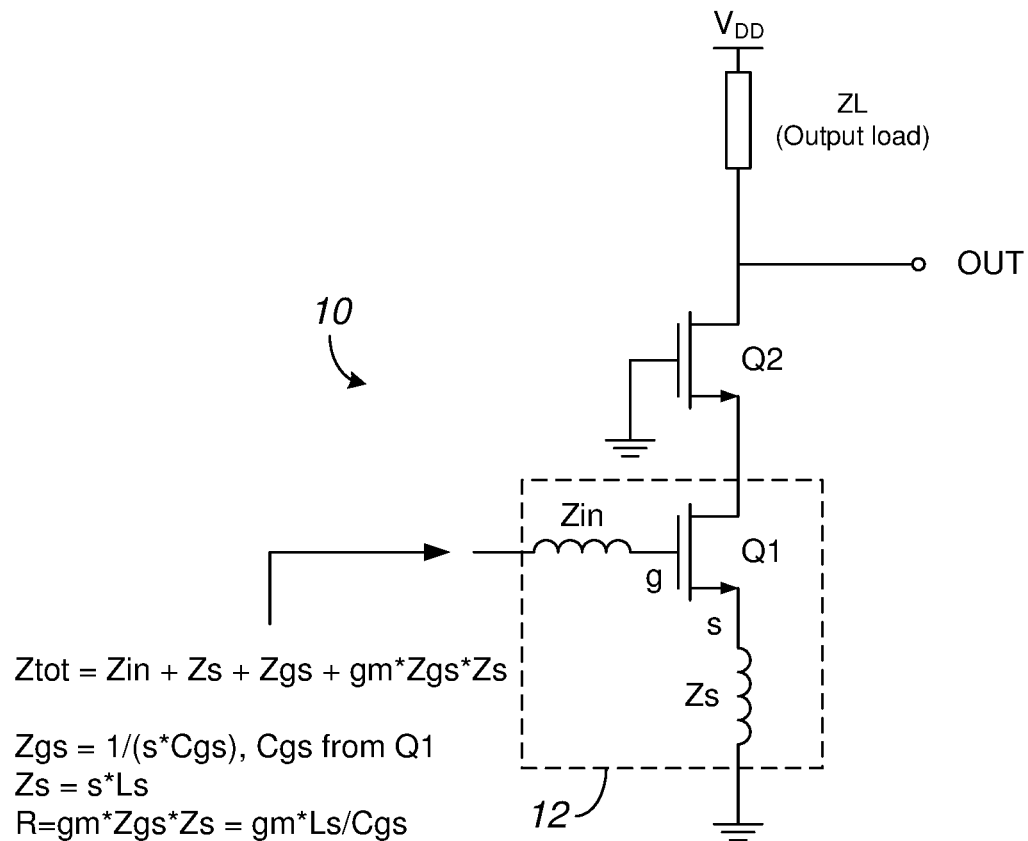
FIG. 3 illustrates a typical LNA configured as a cascode amplifier, but without an impedance adjustment circuit.

FIG. 3 shows a typical LNA 10 configured as a cascode amplifier, but without an impedance adjustment circuit. The RF stage 12 is depicted with impedances associated with various portions of the transistor Q1. For example, an input path to the gate of Q1 can have an effective inductance that results in an input impedance Zin presented to an input signal. Similarly, the grounding path of the source of Q1 can have an effective inductance that results in a source impedance Zs. One or more other impedances can arise from Q1, including, for example, a gate-to-source impedance Zgs and a transconductance related impedance gm*Zgs*Zs. Thus, with such example impedances, a total impedance Ztot presented to the input RF signal can be expressed as Ztot=Zin+Zs+Zgs+gm*Zgs*Zs.

Figure 4:
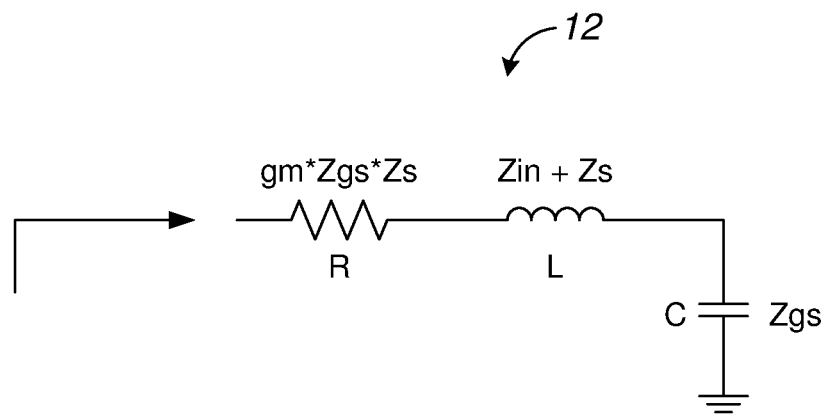
FIG. 4 illustrates an example of how the RF stage of FIG. 3 can be represented as an RLC circuit.

FIG. 4 shows an example of how the RF stage 12 of FIG. 3 can be represented as an RLC circuit 12. Such a circuit can include a resistance R having one end at the input and the other end connected to one end of an inductance L. The other end of the inductance L can be coupled to ground through a capacitance C. The resistance R can be associated with the transconductance term gm*Zgs*Zs, the inductance L can be associated with a sum of Zin and Zs, and the capacitance C can be associated with Zgs. In such a representation, the resonance frequency can be expressed as $$\omega_o = \frac{1}{\sqrt{LC}}. \quad (1)$$

For the purpose of description, when operated at or near the resonance frequency, the principle contribution to the impedance at the input of the gain stage is the "R" contribution, or gm*Zgs*Zs, which is also equal to gm*Ls/Cgs (where Ls arises from the inductance of the source impedance and Cgs arises from the capacitance of the transconductance term).

Figure 5:
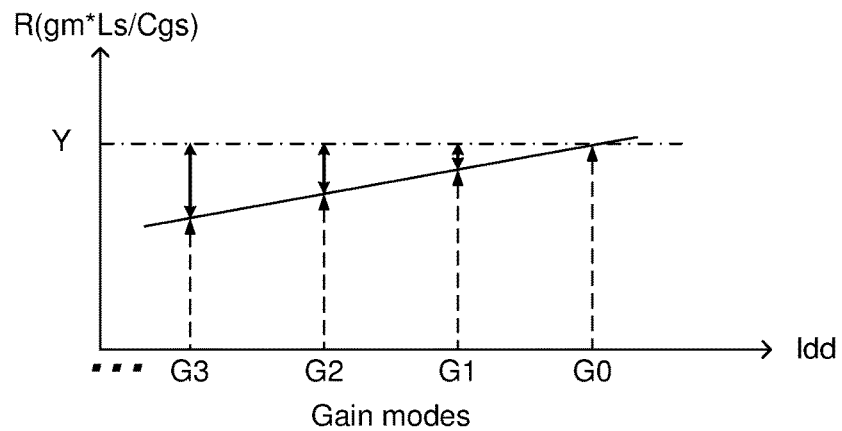
FIG. 5 illustrates that R(gm*Ls/Cgs) of FIGS. 3 and 4 can vary as a function of Idd.

In the example of FIGS. 3 and 4, the LNA 10 can be operated at different gain modes by adjusting the supply current Idd. With such a change in Idd, an electrical parameter such as Cgs can also change. For example, FIG. 5 shows that R(gm*Ls/Cgs) of FIGS. 3 and 4 can vary as a function of Idd. Thus, at a first Idd setting for an example gain mode G3, R can have a first value. Similarly, a second Idd setting for a gain mode G2 can result in R having a second value that is greater than the first R value. Continuing such a trend, third and fourth settings for gain modes G1 and G0 can result in R having third and fourth values having successively greater values. Thus, in FIG. 5, the solid line depicts an example relationship between R and Idd.

In the example of FIGS. 3 and 4, the foregoing variation in R can result in a corresponding variation in impedance as a function of Idd. Such a variation in impedance may be undesirable. Accordingly, it may be advantageous to adjust the R value to achieve a substantially constant value of R across multiple gain modes and supply currents. This targeted value of R is shown as a dashed-dotted line in FIG. 5 at the value Y. The target value, Y, can typically be 50Ω in wireless communication applications.

Figure 6:
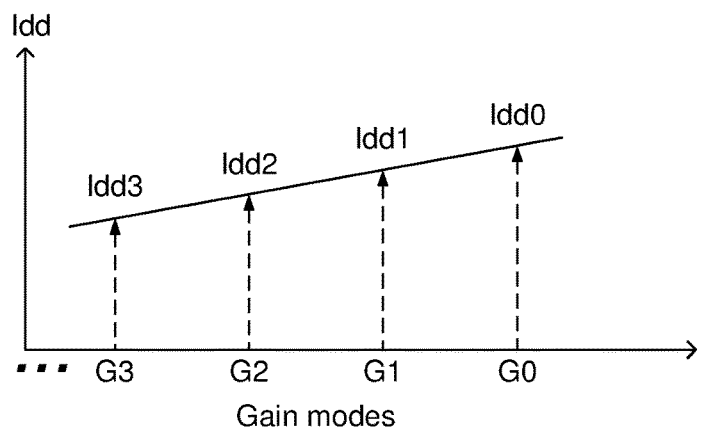
FIG. 6 illustrates the variation in supply current as a function of gain mode.
Figure 7:
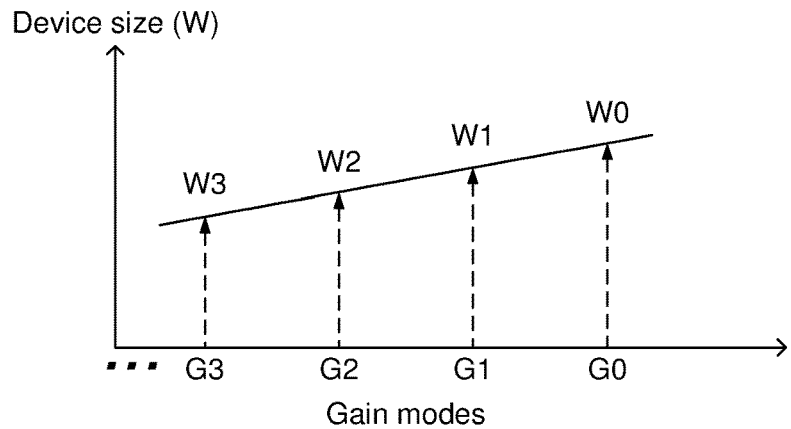
FIG. 7 illustrates the relationship between the device size, W, and supply current, Idd, for different gain modes gain mode.

FIG. 6 illustrates the variation in supply current as a function of gain mode. FIG. 7 illustrates the relationship between the device size, W, and supply current, Idd, for different gain modes. Accordingly, for a fixed source inductance, Ls, a targeted R value can be achieved by maintaining the ratio gm/Cgs relatively constant. This can be achieved by scaling the width of the device at the same rate as the supply current changes over gain modes.

Because real impedance as a function of gain mode changes (e.g., it increases with higher gain) there arises an undesirable gap between the real R value at the input and the target R value (e.g., the value that reduces or minimizes signal degradation). Accordingly, described herein are impedance adjustment circuits that include scalable gain stages configured to provide a constant real value R. These scalable gain stages can be configured to make the ratio gm/Cgs substantially constant. The impedance adjustment circuit includes mechanisms and elements that are configured to effectively scale the device width (W) at the same rate as the supply voltage for provided gain modes. This results in a fixed real impedance at a targeted value. The device size ratio is roughly proportional to the supply current ratio (e.g., Idd0/Idd1≈W0/W1, Idd1/Idd2≈W1/W2, and Idd2/Idd3≈W2/W3).

Figure 8:
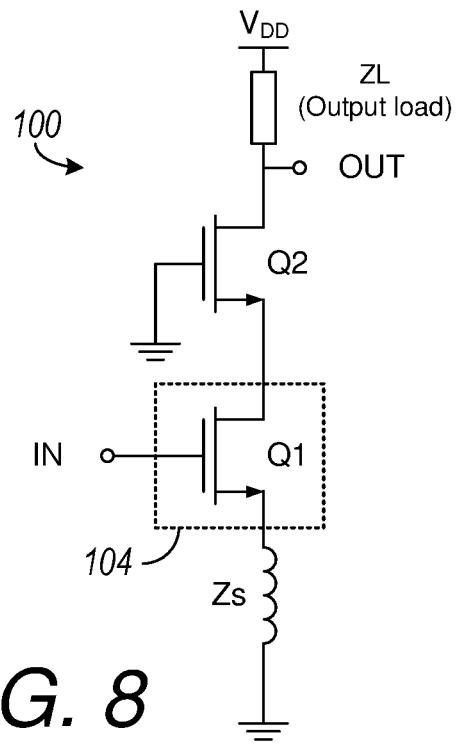
FIGS. 8 and 9 illustrate an example of a scalable gain stage that can be implemented for a signal amplifier, providing a variable input impedance.
Figure 9:
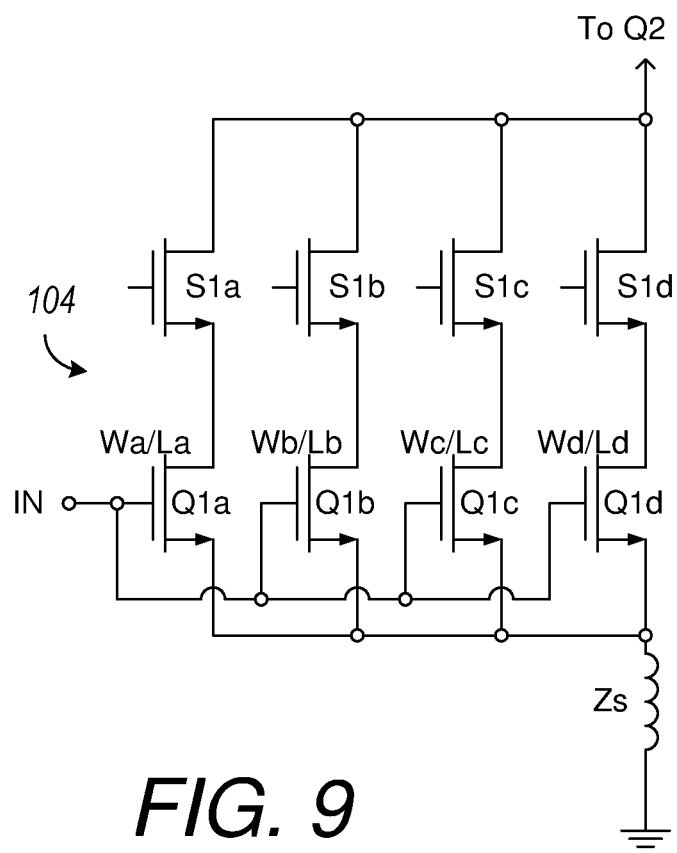

This can be achieved with an impedance adjustment circuit that includes a scalable gain stage that is configured to create a fixed real impedance across different gain modes. FIGS. 8 and 9 illustrate an example of a scalable gain stage 104 that can be implemented for a signal amplifier 100 (e.g., an LNA). The scalable gain stage 104 can include a plurality of switches S1a-S1d and corresponding RF stage transistors Q1a-Q1d and routing a signal through one or more of such RF stage transistors in selective manners.

The scalable gain stage 104 includes four example RF stage transistors Q1a, Q1b, Q1c, Q1d implemented in a parallel manner to allow processing of an input signal through one or more of the RF stage transistors Q1a, Q1b, Q1c, Q1d. More particularly, the input node IN is shown to be coupled to each gate of the four RF stage transistors Q1a, Q1b, Q1c, Q1d, and the drain of each RF stage transistor is shown to be routed to a cascode stage transistor Q2 (not shown in FIG. 9) through a respective switch transistor S1a, S1b, S1c, S1d. For example, the drain of Q1a can be routed to Q2 through a first switch transistor S1a, the drain of Q1b can be routed to Q2 through a second switch transistor S1b, and so on. Configured in the foregoing example manner, a signal can be processed through one or more parallel RF stage transistors.

As described herein, gm decreases with decreases in supply current. By selectively adding or removing RF stage transistors, an effective device size of the scalable gain stage 104 can be changed. By decreasing the device size with decreasing gain, a substantially constant real impedance can be achieved. It is noted that the effect on supply current, Idd, can depend on one or more dimensions (indicated as W/L in FIG. 8) of the RF stage transistors. Thus, in the example of FIG. 9, the dimensions Wa/La, Wb/Lb, Wc/Lc, Wd/Ld corresponding to the RF stage transistors Q1a, Q1b, Q1c, Q1d can be selected to provide different effective values of the device size when switched in and out. For example, in a high gain mode (G0), the four RF stage transistors can be activated by turning the respective switches on. In a second gain mode (G1) lower than the high gain mode (G0), three of the four RF stage transistors can be activated by turning the respective switches on (e.g., RF stage transistors Q1b, Q1c, Q1d). In a third gain mode (G2) lower than the second gain mode (G1), two of the four RF stage transistors can be activated by turning the respective switches on (e.g., RF stage transistors Q1c, Q1d). This can continue for any suitable number of gain modes and RF stage transistors in the scalable gain stage 104. It will be understood that such dimensions Wa/La, Wb/Lb, Wc/Lc, Wd/Ld can be all substantially the same, all different, or any combination thereof. Configured in the foregoing manner, different net R values can be obtained for different gain modes. As described herein, dimensions of the RF stage transistors Q1a, Q1b, Q1c, Q1d can be selected to provide targeted R values.

Accordingly, FIGS. 8 and 9 illustrate a signal amplifier 100 having an input impedance that varies over different bias currents, the signal amplifier 100 including a gain stage 104 including a plurality of switchable amplification branches each capable of being activated such that one or more of the activated amplification branches provides a targeted, tailored, or desired adjustment to the input impedance. Similarly, FIGS. 8 and 9 illustrate a signal amplifier 100 including a variable-gain stage 104 configured to provide a plurality of gain levels that result in different input impedance values presented to a respective signal by the variable-gain stage 104. The variable-gain stage 104 includes a plurality of switchable amplification branches each capable of being activated such that one or more of the activated amplification branches provides a targeted, tailored, or desired adjustment to the respective input impedance values.

Figure 10:
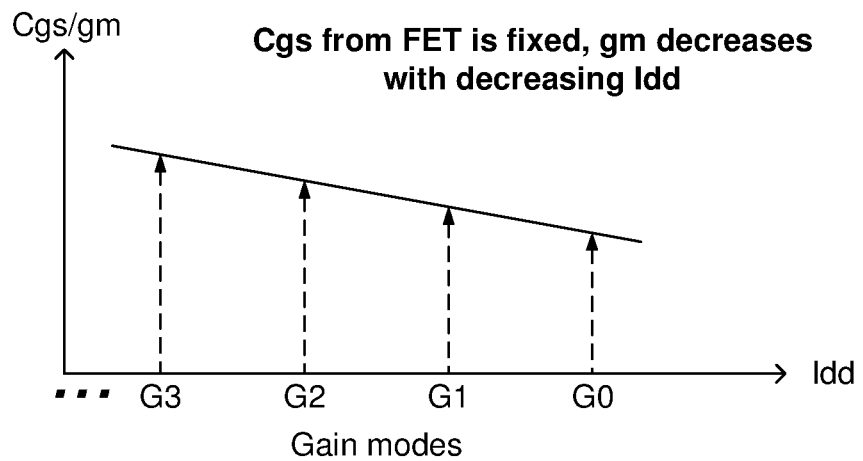
FIG. 10 illustrates a plot of Cgs/gm as a function of different gain modes.
Figure 11:
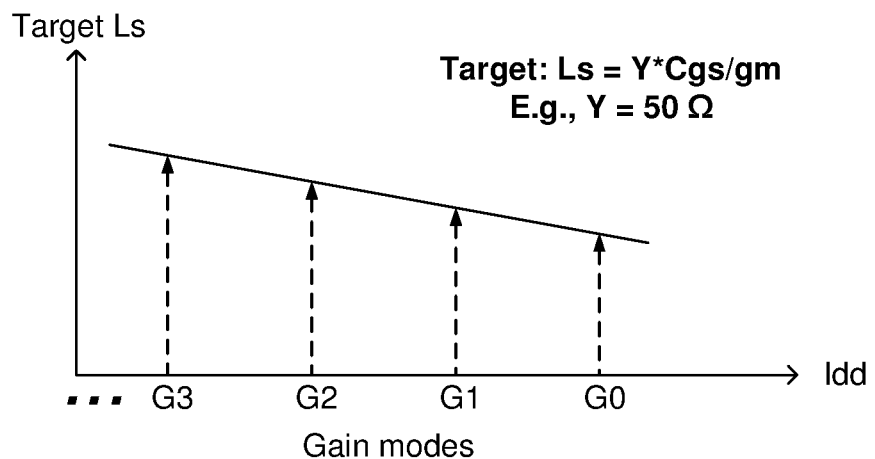
FIG. 11 illustrates a plot of target impedance value, Ls, as a function of supply voltage and gain mode.

FIG. 10 shows plots of Cgs/gm as a function of different gain modes (e.g., that depend on Idd). For the RF stage transistor (e.g., a FET), the value of Cgs changes relatively little compared to gm for changes in supply voltage. Accordingly, it is suitable to approximate Cgs as remaining substantially fixed while gm decreases with decreasing Idd. This is represented in the plot as the solid line decreasing with increasing supply voltage. Because R is equal to Ls*gm/Cgs, it may be advantageous to tailor the impedance value Ls so that R remains substantially fixed at a target value, Y. This is shown in FIG. 11 where the target impedance value Ls is plotted as a function of supply voltage and gain mode.

To achieve the targeted impedance value Y, the impedance value Ls can be made to be equal to Y*Cgs/gm, illustrated by the solid line in the plot. For example, a typical target value for Y is 500.

Because real impedance as a function of gain mode changes (e.g., it increases with higher gain) there arises an undesirable gap between the real R value at the input and the target R value (e.g., the value that reduces or minimizes signal degradation). Accordingly, described herein are impedance adjustment circuits that include scalable impedance blocks configured to provide a constant real value R. The scalable impedance blocks can be configured to scale the source impedance (Ls) for changing gm so that the real R value remains substantially fixed. The scalable impedance blocks include switches with inductive elements that are configured to provide a scaling inductive value for different gain modes to scale Ls to compensate for changes in gm to achieve a target value of the real R value.

Figure 12:
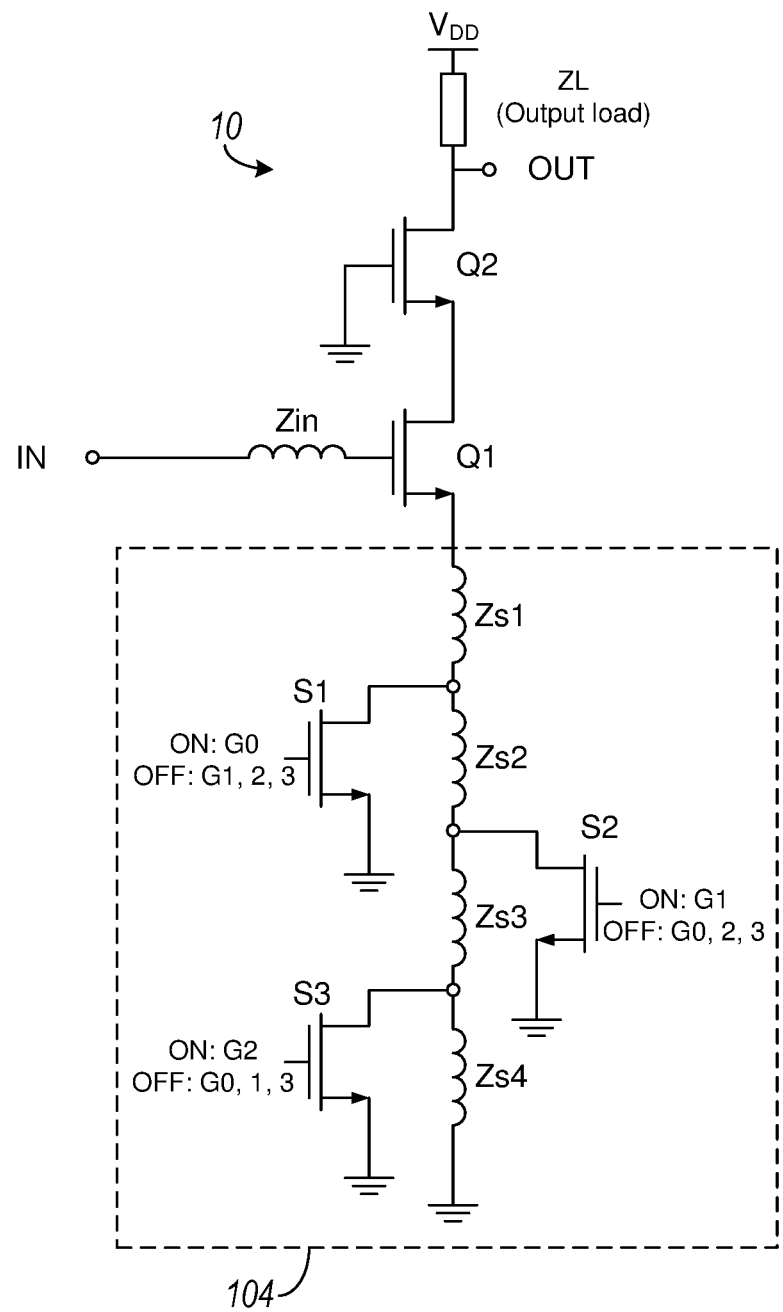
FIG. 12 illustrates an example of a scalable impedance block that acts as an impedance adjustment circuit.

To change the value of Ls as a function of gain mode, a scalable impedance block can be provided that is coupled to the source of an RF stage transistor. FIG. 12 illustrates an example of a scalable impedance block 104 that acts as an impedance adjustment circuit. The scalable impedance block 104 includes inductive elements Zs1, Zs2, Zs3, Zs4 that can be switchably added to the signal amplifier 10 using switches S1, S2, S3. For example, in a first gain mode (G0) the switch S1 can be activated so that the impedance of the scalable impedance block 104 is provided by the inductive element Zs1. Similarly, in a second gain mode (G1) the switch S2 can be activated so that the impedance of the scalable impedance block 104 is provided by the inductive elements Zs1 and Zs2. Moreover, in a third gain mode (G2) the switch S3 can be activated so that the impedance of the scalable impedance block 104 is provided by the inductive elements Zs1, Zs2, and Zs3. In a fourth gain mode (G3) all of the switches S1-S3 can be deactivated so that the impedance of the scalable impedance block 104 is provided by the inductive elements Zs1, Zs2, Zs3, and Zs4. In this way, the impedance can be scaled with changes in the gain mode. For example, the impedance can increase with decreasing gain or supply voltage to compensate for changes in the impedance thereby providing a substantially constant target impedance at the input (IN) of the signal amplifier 10.

In the examples described herein, the impedance adjustment circuits are described as generally canceling or compensating for described effects. It will be understood that such effects may or may not be known. By utilizing one or more features of the present disclosure, an operating parameter such as impedance at an LNA can be configured into any profile (including a substantially flat profile) with or without knowledge of such uncompensated effects.

Accordingly, FIG. 12 illustrates a signal amplifier 10 that includes a variable-gain stage configured to provide a plurality of gain levels that result in different input impedance values presented to a respective signal by the variable-gain stage. The variable-gain stage includes a scalable impedance block 104 having a plurality of switchable inductive elements that are configured to be activated to provide a targeted adjustment to the respective input impedance values.

Products, Modules, Devices, and Architectures

Figure 13:
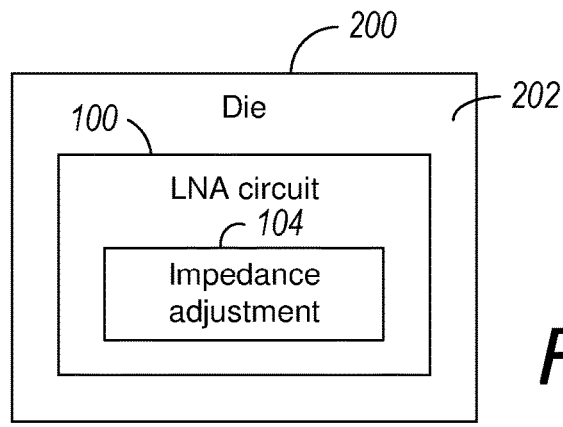
FIG. 13 shows that, in some embodiments, some or all of the features described herein can be implemented on a semiconductor die.

FIG. 13 shows that in some embodiments, some or all of an LNA 100 having one or more features as described herein can be implemented on a semiconductor die 200. Such a die can include a substrate 202, and at least some of an impedance adjustment circuit 104 can be implemented on the substrate 202.

Figure 14:
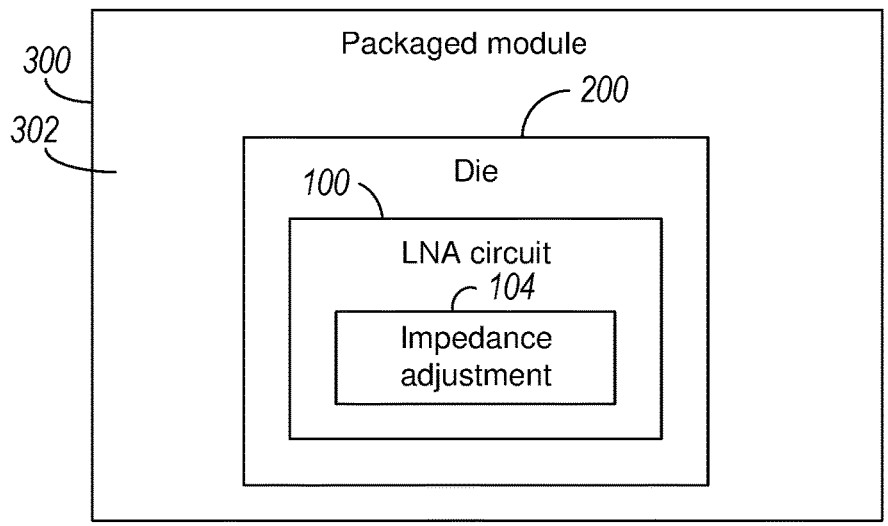
FIGS. 14 and 15 show that, in some embodiments, some or all of the features described herein can be implemented on a packaged module.
Figure 15:
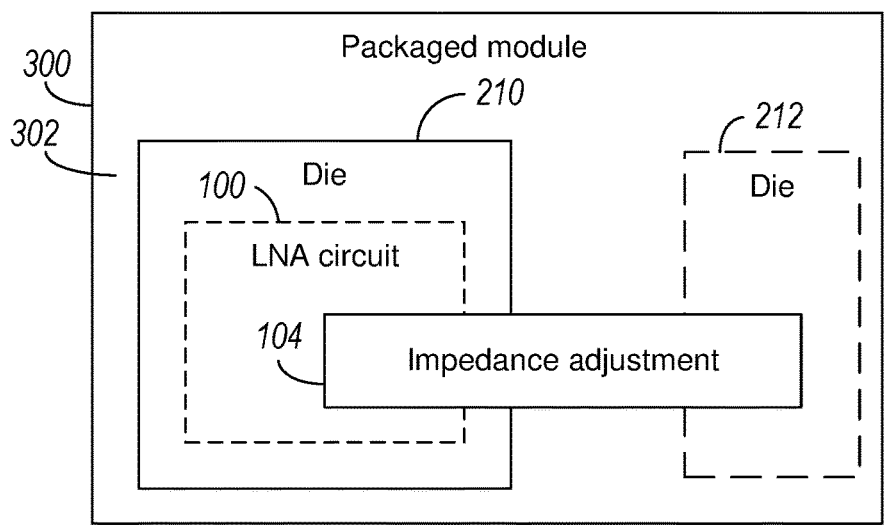

FIGS. 14 and 15 show that in some embodiments, some or all of an LNA 100 having one or more features as described herein can be implemented on a packaged module 300. Such a module can include a packaging substrate 302 configured to receive a plurality of components such as one or more die and one or more passive components.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 16:
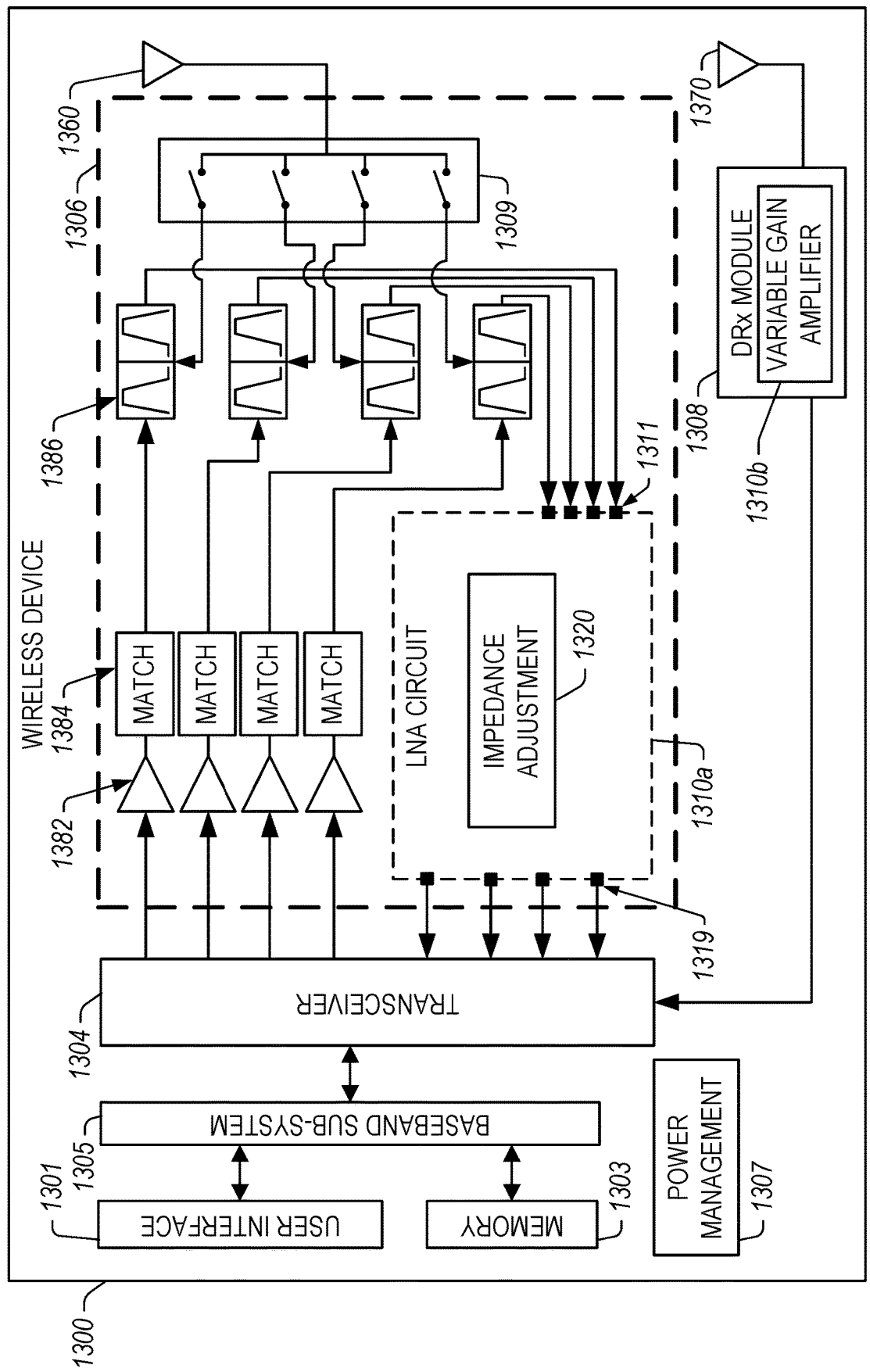
FIG. 16 depicts an example wireless device having one or more advantageous features described herein.

FIG. 16 depicts an example wireless device 1300 having one or more advantageous features described herein. In some embodiments, an LNA having one or more features as described herein can be implemented in each of one or more places in such a wireless device. For example, in some embodiments, such advantageous features can be implemented in a module such as a diversity receive (DRx) module 1308 having one or more low-noise amplifiers (LNAs).

FIG. 16 depicts an example wireless device 1300 having one or more advantageous features described herein. In the context of one or more modules having one or more features as described herein, such modules can be generally depicted by a dashed box 1306 (which can be implemented as, for example, a front-end module) and a diversity receiver (DRx) module 1308 (which can be implemented as, for example, a front-end module).

Referring to FIG. 16, power amplifiers (PAs) 1382 can receive their respective RF signals from a transceiver 1304 that can be configured and operated to generate RF signals to be amplified and transmitted, and to process received signals. The transceiver 1304 is shown to interact with a baseband sub-system 1305 that is configured to provide conversion between data and/or voice signals suitable for a user and RF signals suitable for the transceiver 1304. The transceiver 1304 can also be in communication with a power management component 1307 that is configured to manage power for the operation of the wireless device 1300. Such power management can also control operations of the baseband sub-system 1305 and the modules 1306 and 1308.

The baseband sub-system 1305 is shown to be connected to a user interface 1301 to facilitate various input and output of voice and/or data provided to and received from the user. The baseband sub-system 1305 can also be connected to a memory 1303 that is configured to store data and/or instructions to facilitate the operation of the wireless device, and/or to provide storage of information for the user.

In the example wireless device 1300, outputs of the PAs 1382 are shown to be matched (via respective match circuits 1384) and routed to their respective duplexers 1386. Such amplified and filtered signals can be routed to a primary antenna 1360 through a switching network 1309 for transmission. In some embodiments, the duplexers 1386 can allow transmit and receive operations to be performed simultaneously using a common antenna (e.g., primary antenna 1360). In FIG. 16, received signals are shown to be routed to a variable gain amplifier assembly 1310a, which provides the features and benefits of the variable gain amplifiers described herein. The DRx module 1308 includes a similar variable gain amplifier assembly 1310b as well.

In the example wireless device 1300, signals received at the primary antenna 1360 can be sent to a variable gain amplifier 1310a in the front end module 1306. The variable gain amplifier 1310a can include an impedance adjustment circuit 1320. The variable gain amplifier 1310a is configured to receive a plurality of signals at inputs 1311 and output a plurality of processed signals at outputs 1319. The variable gain amplifier 1310a is configured to amplify signals based at least in part on a gain mode and to provide adjustments to input impedance with the impedance adjustment circuit 1320 based at least in part on the gain mode. This can be done to reduce or eliminate power loss by fixing LNA input impedance to transfer maximum power over gain modes. The impedance adjustment circuit 1320 can be configured to improve receive NF performance by reducing or minimizing impedance mismatches from the previous signal processing stage. The impedance adjustment circuit 1320 can be configured to maintain pre-LNA filter performance by reducing or eliminating impedance mismatch with the LNA circuit.

The wireless device also includes a diversity antenna 1370 and a diversity receiver module 1308 that receives signals from the diversity antenna 1370. The diversity receive module 1308 includes a variable gain amplifier 1310b, similar to the variable gain amplifier 1310a in the front end module 1306. The diversity receiver module 1308 and the variable gain amplifier 1310b process the received signals and transmit the processed signals to the transceiver 1304. In some embodiments, a diplexer, triplexer, or other multiplexer or filter assembly can be included between the diversity antenna 1370 and the diversity receiver module 1370, as described herein.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1. It is to be understood that the term radio frequency (RF) and radio frequency signals refers to signals that include at least the frequencies listed in Table 1.

TABLE 1

| Band | Mode | Tx Frequency Range (MHz) | Rx Frequency Range (MHz) |
|------|------|--------------------------|--------------------------|
| B1   | FDD  | 1,920–1,980              | 2,110–2,170              |
| B2   | FDD  | 1,850–1,910              | 1,930–1,990              |
| B3   | FDD  | 1,710–1,785              | 1,805–1,880              |
| B4   | FDD  | 1,710–1,755              | 2,110–2,155              |
| B5   | FDD  | 824–849                  | 869–894                  |
| B6   | FDD  | 830–840                  | 875–885                  |
| B7   | FDD  | 2,500–2,570              | 2,620–2,690              |
| B8   | FDD  | 880–915                  | 925–960                  |
| B9   | FDD  | 1,749.9–1,784.9          | 1,844.9–1,879.9          |
| B10  | FDD  | 1,710–1,770              | 2,110–2,170              |
| B11  | FDD  | 1,427.9–1,447.9          | 1,475.9–1,495.9          |
| B12  | FDD  | 699–716                  | 729–746                  |
| B13  | FDD  | 777–787                  | 746–756                  |

TABLE 1-continued

| Band | Mode | Tx Frequency Range (MHz) | Rx Frequency Range (MHz) |
|---|---|---|---|
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device.

The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for amplifying radio-frequency (RF) signals, the method comprising:
   providing a first supply current to a signal amplifier to set a first gain mode;
   directing an input RF signal through a first RF stage transistor and a cascode transistor to amplify the input RF signal using the first gain mode, the first RF stage transistor having a first device size;
   providing a second supply current to the signal amplifier to set a second gain mode;
   directing the input RF signal through a second RF stage transistor and the cascode transistor to amplify the input RF signal using the second gain mode, the second RF stage transistor having a second device size with a ratio of the first supply current to the second supply current being proportional to a ratio of the first device size to the second device size, the first device size and the second device size configured to result in a targeted impedance presented to the input RF signal at an input of the signal amplifier.

2. The method of claim 1 wherein the targeted impedance is 50 Ω.

3. The method of claim 1 wherein signal amplification in the first gain mode is higher than signal amplification in the second gain mode.

4. The method of claim 3 wherein the first device size is larger than the second device size.

5. The method of claim 1 further comprising turning a first switch on and a second switch off in the first gain mode to direct the input RF signal through the first RF stage transistor and the cascode transistor; and turning the first switch off and the second switch on in the second gain mode to direct the input RF signal through the second RF stage transistor and the cascode transistor.

6. The method of claim 1 wherein the first supply current is higher than the second supply current resulting in the first gain mode being higher than the second gain mode.

7. The method of claim 1 wherein the signal amplifier includes a fixed inductance that is coupled between a reference potential node and a source of each of the first RF stage transistor and the second RF stage transistor.

8. The method of claim 1 wherein the first device size corresponds to a width of the first RF stage transistor and the second device size corresponds to a width of the second RF stage transistor.

9. The method of claim 1 further comprising:
   providing a third supply current to the signal amplifier to set a third gain mode; and
   directing the input RF signal through a third RF stage transistor and the cascode transistor to amplify the input RF signal using the third gain mode, the third RF stage transistor having a third device size with a ratio of the second supply current to the third supply current being proportional to a ratio of the second device size to the third device size.

10. A method for amplifying radio-frequency (RF) signals, the method comprising:
    providing a first supply current to a signal amplifier to set a first gain mode;
    directing an input RF signal through a first plurality of RF stage transistors and a cascode transistor to amplify the input RF signal using the first gain mode, the first plurality of RF stage transistors having a first effective device size configured to result in a targeted impedance presented to the input RF signal at an input of the signal amplifier;
    providing a second supply current to the signal amplifier to set a second gain mode;
    directing the input RF signal through a second plurality of RF stage transistors and the cascode transistor to amplify the input RF signal using the second gain mode, the second plurality of RF stage transistors having a second effective device size different from the first effective device size, the second effective device size configured to result in the targeted impedance presented to the input RF signal at the input of the signal amplifier.

11. The method of claim 10 wherein a ratio of the first effective device size to the second effective device size is proportional to a ratio of the first supply current to the second supply current.

12. The method of claim 10 wherein the targeted impedance is 50 Ω.

13. The method of claim 10 wherein signal amplification in the first gain mode is higher than signal amplification in the second gain mode.

14. The method of claim 13 wherein the first effective device size is larger than the second effective device size.

15. The method of claim 1 further comprising turning a first plurality of switches on and a second plurality of switches off in the first gain mode to direct the input RF signal through the first plurality of RF stage transistors and the cascode transistor; and turning the first plurality of switches off and the second plurality of switches on in the second gain mode to direct the input RF signal through the second plurality of RF stage transistors and the cascode transistor.

16. The method of claim 10 wherein the first supply current is higher than the second supply current resulting in the first gain mode being higher than the second gain mode.

17. The method of claim 10 wherein the signal amplifier includes a fixed inductance that is coupled between a reference potential node and a source of each of the first plurality of RF stage transistors and the second plurality of RF stage transistors.

18. The method of claim 10 wherein the second plurality of RF stage transistors is a subset of the first plurality of RF stage transistors.

19. The method of claim 1 further comprising:
providing a third supply current to the signal amplifier to set a third gain mode; and
directing the input RF signal through a third plurality of RF stage transistors and the cascode transistor to amplify the input RF signal using the third gain mode, the third plurality of RF stage transistors having a third effective device size configured to result in the targeted impedance presented to the input RF signal at the input of the signal amplifier.

* * * * *